United States Patent [19]

Dragone

[11] Patent Number: 6,023,480
[45] Date of Patent: Feb. 8, 2000

[54] FAST TUNABLE MULTIWAVELENGTH LASER WITH FOLDED IMAGING ARRANGEMENT OF NONOVERLAPPING FOCAL REGIONS

[75] Inventor: Corrado Dragone, Little Silver, N.J.

[73] Assignee: Lucent Technologies Inc., Murray Hill, N.Y.

[21] Appl. No.: 09/241,933

[22] Filed: Feb. 2, 1999

[51] Int. Cl.[7] .................................... H01S 3/10
[52] U.S. Cl. .................. 372/23; 372/102; 372/64; 372/99; 372/32; 372/58; 372/21
[58] Field of Search ............................. 372/102, 23, 21, 372/64, 99, 32, 108, 98

[56] References Cited

U.S. PATENT DOCUMENTS

| | | | |
|---|---|---|---|
| 5,321,718 | 6/1994 | Waarts et al. | 372/108 |
| 5,373,517 | 12/1994 | Dragone et al. | 372/20 |
| 5,450,511 | 9/1995 | Dragone | 385/37 |
| 5,841,797 | 11/1998 | Ventrudo et al. | 372/102 |
| 5,881,079 | 3/1999 | Dierr et al. | 372/20 |
| 5,905,745 | 5/1999 | Grubb et al. | 372/102 |

OTHER PUBLICATIONS

U.S. application No. 08/861495, filed May. 22, 1997.
K.R. Poguntke, J. B. D. Soole, A. Scherer, etc. "Simultaneous Multiple Wavelength Operation of a Multistripe Array Grating Integrated Cavity Laser", Appl. Phys. Lett., 1993, 62, (17).

M. Zirngibl, C. H. Joyner, L. W. Stulz, U. Koren, M. D. Chien, M. G. Young and B. I. Miller, "Digitally Tunable Laser Based on the Integeration of a Waveguide Grating Multiplexer and an Optical Amplifier", IEEE Photonics Technol. Lett., Apr. 1994.

M. Zirngibl and C. H. Joyner, "12 Frequency WDM Laser Based on a Transmissive Waveguide Grating Router", Electronic Letters, 28th Apr. 1994, vol. 30, No. 9, pp. 701–702.

C. Doerr, M. Shirasaki and C. H. Joyner, "Chromatic Focal Plane Displacement in Parabolic Chirped Waveguide Grating Router", IEEE Photon. Technol. Lett., vol. 9, pp. 635–627, May 1997.

*Primary Examiner*—Leon Scott, Jr.

[57] ABSTRACT

A compact multiwavelength laser arrangement includes a reflective waveguide grating combined with two arrays of reflecting waveguide elements located in separate focal regions formed by the grating. The laser uses a folded imaging arrangement with nonoverlapping focal regions that eliminates unwanted resonances of previous reflective arrangements. The laser's advantages over existing transmissive laser arrangements include reduced size, faster response time, and increased number of wavelengths.

12 Claims, 9 Drawing Sheets

FAST TUNABLE MULTIWAVELENGTH LASER WITH FOLDED IMAGING ARRANGEMENT OF NONOVERLAPPING FOCAL REGIONS

FIELD OF INVENTION

The present invention relates to optical communication systems using Wavelength Division (WDM), and, more particularly, to a multiwavelength laser for use in such systems.

BACKGROUND OF THE INVENTION

Wavelength Division Multiplexing (WDM) in optical networks has produced the need for improved optical laser sources. In such WDM networks, each fiber must transmit many wavelength channels, which are separated or combined at each node by special filters known as wavelength routers. A multiwavelength laser [1–4] is attractive for use as the optical source since it is capable of producing a large number of closely spaced wavelengths. (Note, the numbers in brackets refers to a reference listed in the Appendix.) By using a multiwavelength laser as a source, the destination of each channel can be changed by changing its wavelength. Prior art multiwavelength laser arrangements have used a transmissive grating [2–4], but when the wavelengths are very closely spaced the grating becomes impractical because of its size. It is then attractive to replace the transmissive grating [3] with a reflective grating [5], but, unfortunately, such a multiwavelength laser design exhibits unwanted resonances, caused by direct feedback and unwanted images, that must be eliminated.

What is needed is a multiwavelength laser having closely spaced wavelengths and reduced size and which does not exhibit unwanted resonances.

SUMMARY OF THE INVENTION

The problems of the prior art are solved by my compact multiwavelength laser arrangement including a reflective waveguide grating having a separate focal region for each of its two arrays of reflecting waveguide elements. My multiwavelength laser uses a folded imaging arrangement with nonoverlapping focal regions that eliminates unwanted resonances of previous reflective arrangements. The laser's advantages over existing transmissive laser arrangements include reduced size, faster response time, and increased number of wavelengths.

More particularly, my multiwavelength laser comprises a laser cavity including a reflective grating, at least a first reflective active element and a plurality of second reflective active elements. The reflective grating includes an array of reflecting arms having lengths that vary in a non-linear manner so as to produce a focal length that varies as a function of wavelength. The reflective grating has two foci including a fixed first focus at which said at least a first reflective active element is located and a variable second focus which is wavelength dependent and it describes a focal curve at which said plurality of second reflective active elements are located. The first and second foci are located at substantially different distances from said reflective grating so that any direct reflection of a wavelength is sufficiently reduced, and the focal length variation with wavelength changes is sufficiently strong so that any wavelength in any passband outside a selected free spectral range passband is substantially reduced when reflected back from said plurality of second reflective active elements to said at least a first reflective active element.

According to one feature, the reflective grating includes an array of reflector elements each including a multimode waveguide section. In yet another feature each of said multimode waveguide sections is terminated in a corner reflector. In another feature the array of reflector elements each have a length that is determined by a non-linear expression including a quadratic component. In yet another feature, the at least a first reflective element has a width W determined by the expression $W^2/\lambda<\rho$, where $\rho$ is the distance between the first and second foci and $\lambda$ is the wavelength.

According to one aspect of the invention the second foci varies with wavelength $\lambda$ given by the expression $$\frac{1}{f(\lambda)} = 2\left(\frac{1}{R} + \alpha\frac{\lambda-\lambda_1}{a^2}\right)$$

where $\lambda_1$ is the laser center wavelength for which $f=R/2$, $\alpha$ is the quadratic component amplitude, and $a$ is the period of the waveguide grating. In another aspect, the angle $\phi$ formed by the axis of a second reflector active element with respect to the focal line, satisfies the condition that $\phi>\phi_0$ where $$2\phi_0 = \frac{a(2M+1)}{d}$$

and where $2M+1$ is the number of arms in the reflective grating, $a$ is the spacing of the arms and $d$ is the distance of that second reflector element from the grating.

In one embodiment, the multiwavelength laser cavity further includes a second active element located at the first focus, the second active element being electrically controlled to switch a mulitwavelength laser output signal from said second active element.

BRIEF DESCRIPTION OF THE DRAWING

In the drawings.

In the following description, identical element designations in different figures represent identical elements. Additionally, in the element designations the first digit refers to the figure in which that element is first located (e.g., 110 is located in FIG. 1).

GENERAL DESCRIPTION

Figure 1:
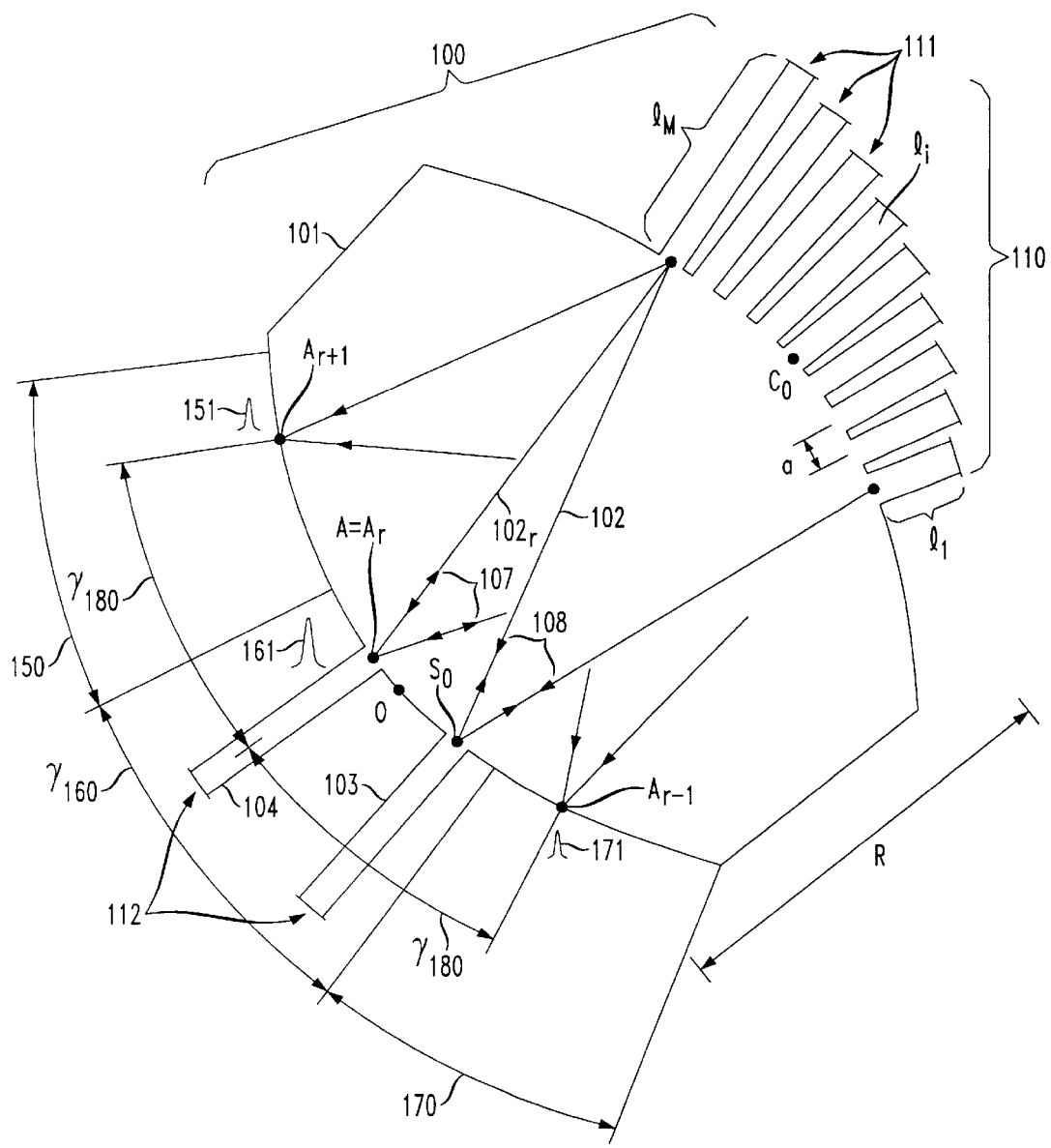
FIG. 1 shows an illustrative diagram of a multiwavelength laser with a folded arrangement which is useful in understanding the problems solved by the present invention.
Figure 3:
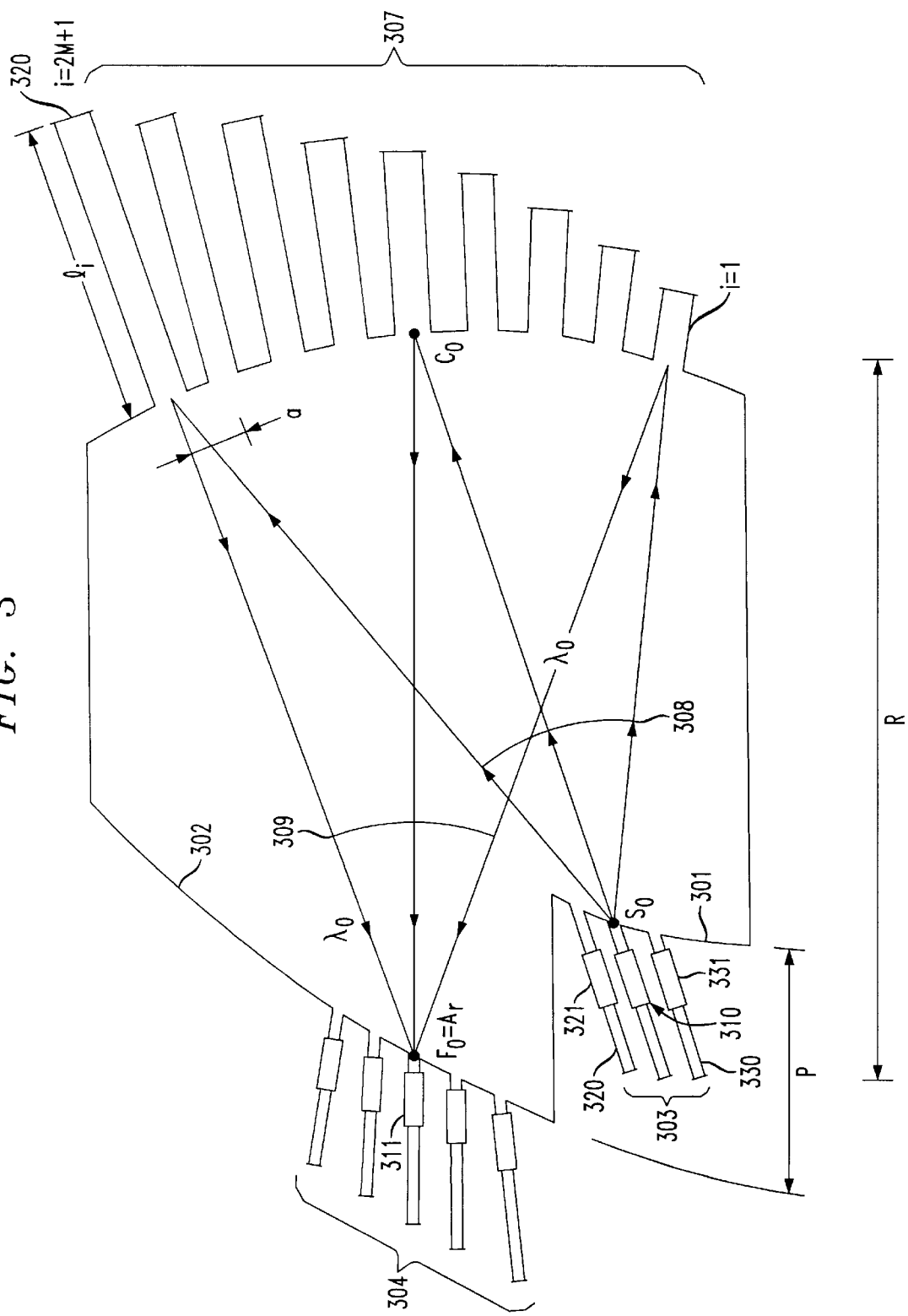
FIG. 3 shows, in accordance with the present invention, an illustrative multiwavelength laser with a folded imaging arrangement of nonoverlapping focal regions.
Figure 4:
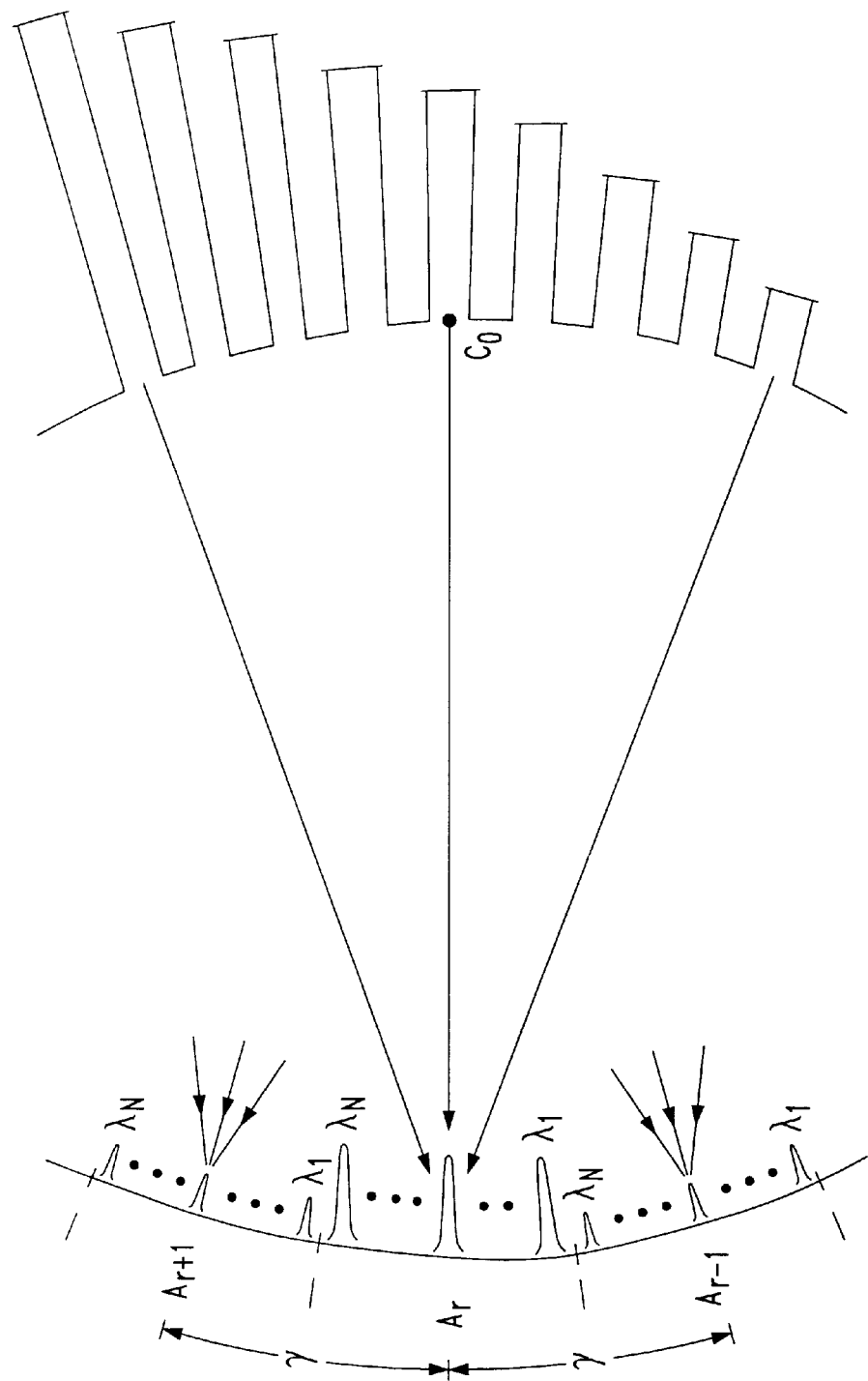
FIG. 4 shows that if the focal length is independent of wavelength then the various images of different orders fall on a circle of radius R centered at the center $C_0$ of the grating aperture.

FIG. 1 illustratively shows a reflective grating 100 consisting of a free space region 101 and a periodic array of reflective apertures, each connected to a waveguide 110 of suitable length terminated by a reflector 111. The waveguides 110 have different optical lengths $l_1, l_2, l_3, \ldots, l_{M_0}$ where $M_0$ is the total number of array elements. In the prior art, the difference $l_i-l_{i-1}$ between adjacent elements was assumed to be essentially a constant $\Delta_0$ independent of i. In accordance with my invention, however, the difference $l_i-l_{i-1}$ includes a linear component $\Delta_1$ that varies linearly with i. The result is that the length of a waveguide $l_i$ varies in a non-linear (e.g., quadratic) manner with i. As will be discussed later, this non-linear variation in the length of the waveguides of grating 110 will effectively cause the focal length of the grating (which in FIG. 1 is half the distance R of $C_0$ from 0) to become approximately a linear function of the wavelength. The purpose of the linear component will be discussed in a later paragraph. Initially, however, it is convenient to assume $\Delta_1=0$, so as to obtain properties similar to those discussed in reference [6]. Then, the grating 100 is characterized by a field of view 160 of angular width $\gamma$ determined by the spacing 'a' of the array apertures. Notice that the various waveguides (or array elements) of grating 110 are directed radially towards a common central point 0 whose distance R from the center $C_0$ of the grating 110 determines the focal length $f_0=R/2$ of the grating for $\Delta_1=0$. As discussed in reference [6], the grating angular dispersion gives rise to wavelength dependent imaging (not shown in FIG. 1, but illustrated in FIG. 4). Thus, when the grating is illuminated by a point source $S_0$ of wavelength $\lambda$, a set of equally spaced reflection images 151, 161, and 171, located at $A_{r-1}, A_r, A_{r+1}$, is produced in different regions 170, 160, and 150, respectively. Note, for clarity purposes only one wavelength $\lambda$ is shown in FIG. 1 to radiate from source $S_0$, as shown in FIG. 4. The laser device can be controlled so that its wavelength can be switched to anyone of a set of values $\lambda_1, \ldots, \lambda_N$. Alternatively, all these wavelengths can be simultaneously produced if sufficient gain is simultaneously provided to all of them. As shown in FIG. 3, each of the wavelengths $\lambda 1-\lambda N$ are formed by repeated reflections between the reflecting element 303, reflective grating 307, and one of the reflecting elements 304. Each multiwavelength laser output is taken from the source element located in the vicinity of $S_0$.

Returning to FIG. 1, the angular spacing of these images $\gamma$, 180, is equal to tie field-of-view 160 width $\gamma$ and, therefore, only one of these images (i.e., 161) is produced within the field of view 160. The other images 151 and 171, produced in intervals 150 and 170, respectively, outside the field of view 160, have smaller intensity. It is possible, by properly designing the grating as in reference [7], to cause the intensities 151 and 171 to be substantially smaller than the dominant image intensity 161 produced inside the field of view 160. Then neglecting waveguide losses, most of the power radiated by the source $S_0$ is transferred to the dominant image 161. In the following we denote by A the location of this particular image 161 produced within the field of view 160. Notice the source $S_0$ in the example of FIG. 1 is located on a circle of radius R centered at $C_0$. As a consequence, the reflected image A is produced on the same circle. The image location A is a function of the wavelength $\lambda$. Notice that FIG. 1 includes two reflective terminating elements, 103 and 104, each consisting of a waveguide of suitable length terminated in a reflector 112. The element 103 is located at the source location $S_0$ and, the other element 104 is placed at a particular image location A corresponding to a particular wavelength. Then an image produced at this particular wavelength will be reflected back towards the grating 110 thus producing a reflected wave 108 converging towards the source location $S_0$. A cavity is thus formed. By including sufficient gain in either one (or both) of the waveguides of elements 103 and 104 connected to $S_0$ and A, respectively, the round trip transmission coefficient along the path formed by the grating 100 and the two reflective elements 103 and 104 will exceed unity, and lasing will be possible at the wavelength specified by the locations of $S_0$, A.

Figure 2:
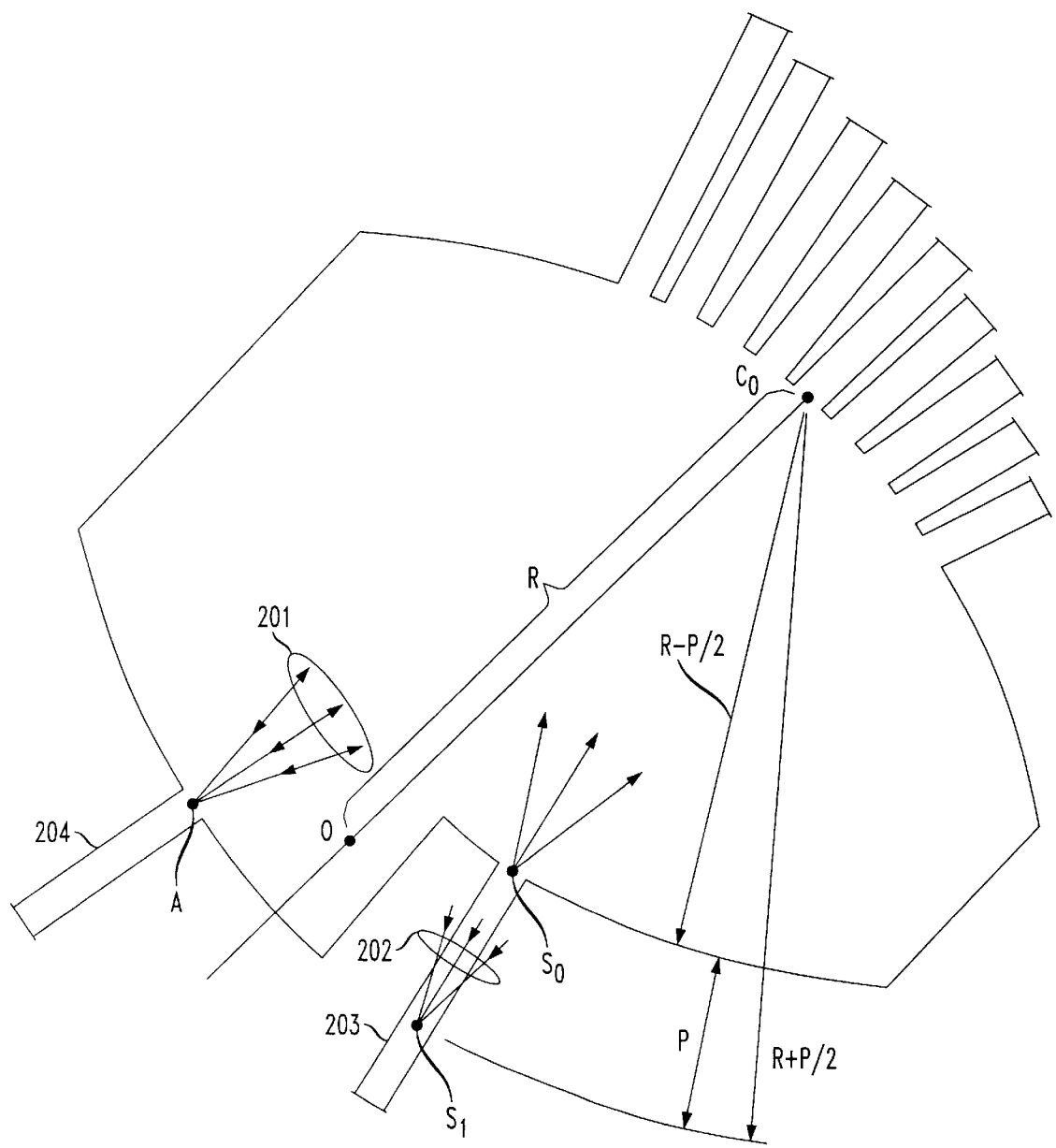
FIG. 2 shows an illustrative diagram of an improved multiwavelength laser having two foci located at different distances from the grating to eliminate direct wavelength feedback in the laser.

The FIG. 1 arrangement designed according to reference [5] has, however, two drawbacks. In the first place, since the image location A is a function of the wavelength, there will exist a wavelength causing A to coincide with $S_0$. Then, at this wavelength, the round trip transmission coefficient may exceed unity, and lasing may occur at this wavelength. This problem, caused by direct feedback, does not arise with a transmissive grating of the type described in reference [4]. In accordance with the present invention, direct feedback is eliminated by reducing (or increasing) the distance of $S_0$ from the center $C_0$ of the grating aperture. This will correspondingly increase (or decrease) the distance of the image A from $C_0$. As a result, the foci $S_0$, A are located on two distinct circles as shown in FIG. 2 and one can show that direct feedback image from the grating to the source $S_0$ is substantially defocused and eliminated if the separation 'ρ' of the two circles is large enough. In fact, the wave 201 reflected by the reflective grating towards $S_0$ is now converging 202 towards a focal point $S_1$ displaced from $S_0$ by the distance ρ, and one can show that only a small fraction of the reflected power will be accepted by the waveguide located at $S_0$ if the waveguide aperture width $W_0$ is large enough, so that $$\frac{\rho\lambda}{W_0^2} > 1.0$$

where $\lambda$ is the wavelength.

Consider next the second drawback of the arrangement of FIG. 1. As described and shown in FIG. 1, the grating 110 produces a set of reflected images of different orders $A_{r-1}, A_r, A_{r+1}$. If the grating 110 is designed as in references [3,7], then the round trip transmission coefficient between $S_0$ and A will essentially exhibit a set of equally spaced peaks, each produced by a particular order r of the grating 110. Each of these peaks is caused by the wavelength dependence of a particular image corresponding to a particular order. Only one of these peaks is wanted, namely the one produced in FIG. 1 at the particular wavelength for which the image $A_r$ is produced at the location of the reflective element 112. However, other images of different orders will be produced at this location. For instance, there will be a wavelength interval for which the image $A_{r-1}$ will occur inside the field of view. In this interval $A_{r-1}$ will become the dominant image of largest intensity, and there will be a wavelength for which $A_{r-1}$ will coincide with the location of the above reflective element. A resonance will then be produced, resulting in an unwanted peak in the round trip transmission coefficient. The wavelength separation of the peaks caused by the various images is a free-spectral range, which is determined by the angular separation γ of the various images divided by the angular dispersion of the grating. Because of the above results, caused by images of different order, the round trip transmission coefficient as a function of wavelength will have approximately periodic behavior producing, in each period, a peak corresponding to a particular order (i.e., 151, 161, etc.). In accordance with the present invention, I reduce all image peaks in all orders (e.g., r+1 and r−1) other than the chosen order r. This insures that the round trip transmission coefficient exceeds unity only in the vicinity of a particular wavelength 161 inside a particular wavelength interval corresponding to a free-spectral range as discussed later. Thus, the other image peaks of orders r+1 and r−1 etc., are significantly reduced using my technique, as will be discussed in detail in a later paragraph.

DETAILED DESCRIPTION

With reference to FIG. 3, my multiwavelength laser is realized in integrated form (in a semiconductor wafer) by means of an imaging arrangement of a reflective grating combined with two sets of active elements. It should be noted that all of the wavelengths produced at a particular output by the multiwavelength laser of FIG. 3 share one active waveguide element, e.g., 310 (of set 303), but each wavelength requires a separate active waveguide element (one of the set 304). Thus, the disclosed multiwavelength laser of FIG. 3 would be particularly useful for applications requiring a large number of wavelengths, as for instance the realization of a large cross-connect switch. When the arrangement of FIG. 3 is used as a cross-connect, the other active waveguide elements 320 and 330 are used as switch outputs. As such the output end of active waveguide elements 320 and 330 are terminated in a partially transmitting reflector. The multiwavelength laser output from each active waveguide elements 320 and 330 is switchably controlled, respectively, by electrically controlled active elements 321 and 331.

As shown in FIG. 3, the two sets of active elements are located in two separate focal regions, 301 and 302, of the grating 307. The separation 'ρ' of the two focal regions is large enough to effectively eliminate direct feedback from the grating 307, which previously limited the use of reflective arrangements [1,2]. As noted previously, direct feedback arises in a reflected arrangement when radiation from a particular active element is reflected back into the active element, thus causing unwanted resonances. Once this problem is eliminated, the reflective arrangement becomes attractive because of its smaller size, particularly when the number of wavelengths is large and their spacing is small. Another advantage of the reflective arrangement, over a transmissive arrangement [3], is its reduced cavity length resulting in faster response. Unwanted modes, which are caused in prior arrangements [3,4] by the router free-spectral range, are eliminated as in reference [5] by including in the router arms a quadratic length variation of large order. The resulting wavelength dependence of the focal length then eliminates the occurrence of overlapping images at wavelengths spaced by the free-spectral range.

The reflective arrangement described here operates in a manner similar to the transmissive arrangement proposed in reference [3]. However, the reflective arrangement has smaller size, faster response due to reduced cavity length, and it is capable of a larger number of wavelengths in a given wavelength interval.

Figure 5:
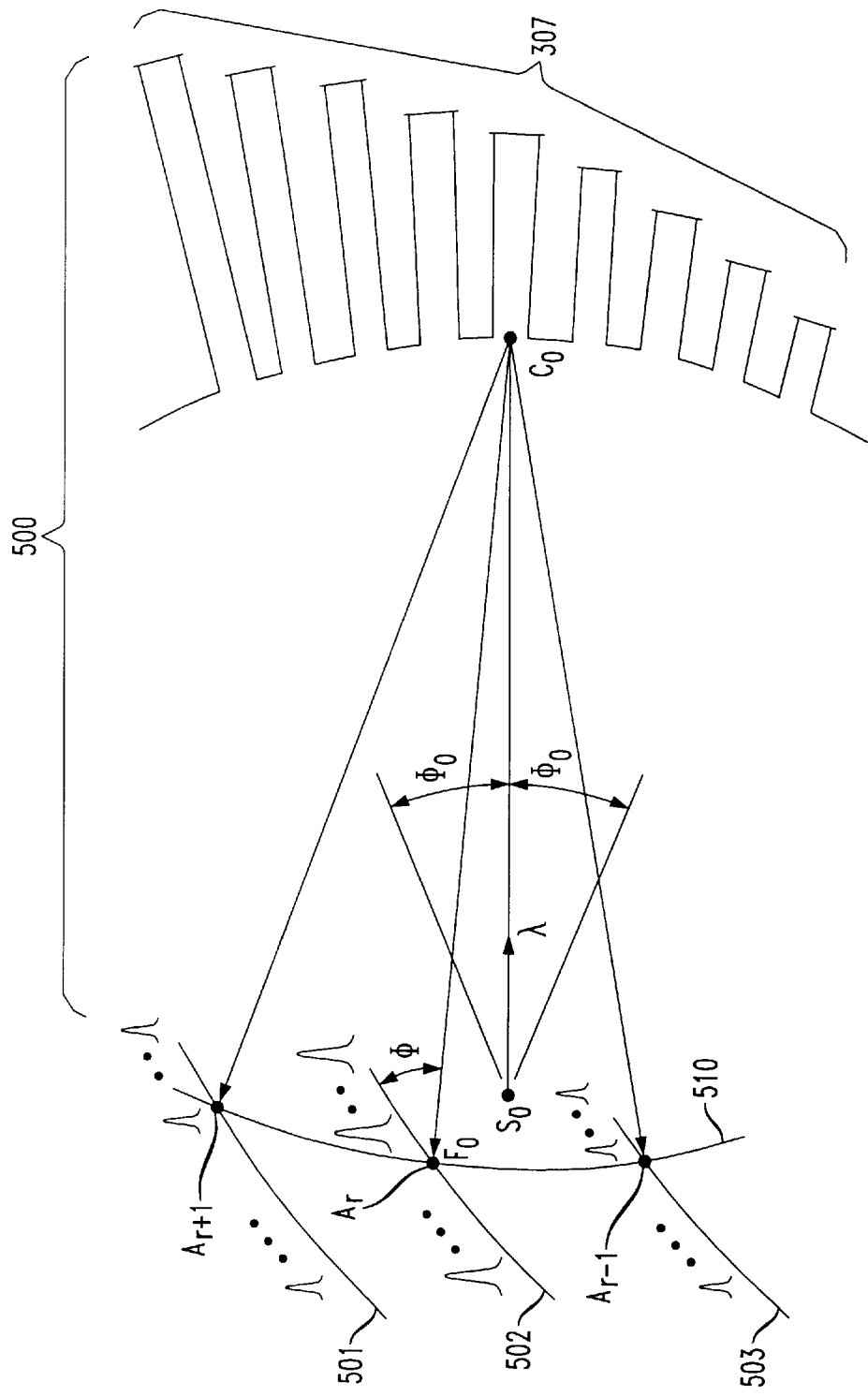
FIG. 5 illustratively shows that the locations of unwanted images fall along the wavelength dependent focal curves for my multiwavelength laser of FIG. 3.

In accordance with the present invention, the images from unwanted modes or orders (e.g., r−1 and r+1 of FIG. 1) of the previous reflective configurations are effectively eliminated by placing the two sets of active elements 303 and 304 on two separate focal curves 301 and 302, respectively of the grating as shown in FIG. 3. The separation p of the two focal curves 301 and 302 is made large enough to insure that the reflected image of a particular active element, e.g., $S_0$, acting as a source is never produced in the vicinity of that active element $S_0$. By using a waveguide grating 307 characterized by a variable focal length (one with a strong variation as a function of wavelength), the occurrence of overlapping of different orders, produced at wavelengths spaced by a free-spectral range, is eliminated. Thus, the unwanted images $\lambda_0$ (shown in FIG. 5 as $A_{r-1}$ and $A_{r+1}$) that appear in the r−1 and r+1 orders do not overlap with the image $S_0$. In this manner, the unwanted resonances are effectively eliminated, and many wavelengths can be simultaneously produced by the multiwavelength laser of FIG. 3.

In the following paragraphs, the detailed operation of the multiwavelength laser of FIG. 3 is described. The grating 307 transforms an incident wave 308 emanating from source $S_0$ at a particular wavelength $\lambda_0$ into a reflected wave 309 converging to a focal point $F_0$. At the elements for $S_0$, $F_0$ we include active elements, 310 and 311, respectively, each consisting of a waveguide including an amplifying or attenuating section whose gain or loss can be controlled by an applied voltage. Each waveguide is terminated at one end (i.e., at 303 and 304 end) by a reflector, which may simply be a cleaved surface of the waveguide as in reference [2], or a reflector etched as in reference [1]. The waveguide reflecting grating 307 has $M_0=2M+1$ arms, where M is an integer, and a reflective termination is provided at the end of each arm. Note, the larger M, the wider is the field of view, and hence the greater number of wavelengths that can be produced within the predefined region 304. The reflector location, e.g., 320, determines for each arm the total round trip path length given by twice the effective length $l_i$ of the waveguide forming the i-th arm. As in reference [5] we design the grating 307 with focal length $f=f(\lambda)$ characterized by a strong variation as a function of the wavelength λ. To this purpose, we include in $l_i$ a quadratic component, superimposed to a linear component, $$2l_i = l_0 + iQ\lambda_0 + ((i-M)^2\alpha)_{rounded}\lambda_1, (i=1, \ldots, 2M+1) \qquad (1)$$

where the integer Q is the order of the linear component, the quadratic component has amplitude α, and $l_0$ is a constant. The quadratic term causes the focal length $f$ to vary with λ. At $\lambda=\lambda_1$, the quadratic term can be ignored, since it is an integer multiple of λ, and the focal length is then simply determined by the grating radius of curvature R. On the other hand, for λ different from $\lambda_1$.

$$\frac{1}{f(\lambda)} = 2\left(\frac{1}{R} + \alpha\frac{\lambda - \lambda_1}{a^2}\right) \qquad (2)$$

where α is the period of the reflective waveguide grating 307 and $\lambda_1$ is the design wavelength for which $f=R/2$.

With reference to FIG. 4, notice that if the focal length is independent of wavelength as in the prior art, radiation from $S_0$ at a particular wavelength λ will generally produce after reflection several images $A_{r-1}$, $A_r$, $A_{r+1}$, etc. corresponding to grating lobes of different orders, r−1, r, and r+1, respectively. These images are equally spaced by the angular width γ of the grating field of view. Because of the grating angular dispersion, their angle from the grating axis is a function of wavelength. However, in a conventional grating, the distance of the above images from the grating is wavelength independent. Then these images are located to a good approximation on a circle centered at $C_0$ as shown in FIG. 4 and, instead of describing a set of distinct curves as in FIG. 5, they vary on the above circle. Then, at any particular point on this circle 510, a particular active element would then cause the periodic appearance of an image (e.g., $A_{r-1}$, $A_r$, $A_{r+1}$, etc.), produced at equally spaced wavelengths separated by the free-spectral range. On the other hand, by using our arrangement, these images describe different curves 501, 502, 503. In contrast to the conventional grating, with reference to FIG. 5 and in accordance with the present invention, because of the focal length variation $f(\lambda)$ of my grating 307, different wavelengths always cause the images produced by a particular active element to appear at different locations. Because of the wavelength dependence $f(\lambda)$, these images in the various orders, e.g., $A_{r-1}$, $A_r$, $A_{r+1}$, lie on distinct focal curves, 503, 502, and 501, respectively, whose separation is determined by the coefficient $\alpha$, in Eq. (2). By properly choosing the location $S_0$ of the active element, one can insure that none of the above focal curves, corresponding to the various images $A_{r-1}$, $A_r$, $A_{r+1}$, etc. of $S_0$, passes in the vicinity of $S_0$.

As shown in FIG. 3, a multiwavelength laser is thus constructed in the manner of reference [3] by combining the reflecting grating 307 with suitable active elements 310 and 311 placed in the vicinity of the two foci $S_0$ and $F_0$. The reflective elements in the vicinity of these two foci are all located within the field of view of the grating. Those in the vicinity of $S_0$ are placed on a particular focal curve, corresponding to a particular order r of the grating. This line is simply the r-th conjugate curve of the focus $S_0$. That is, it is the locus curve described by the locus corresponding to the r-th image $A_r$ of $S_0$. Similarly, the reflective elements in the vicinity of $S_0$ are located on the r-th conjugate curve of $F_0$. Since the various reflective elements are all placed within the field of view of the grating, each set of resonances, produced by the reflective elements in the vicinity of $F_0$, by activating a particular element in the vicinity of $S_0$, are within the width of a free-spectral range. Each of these wavelengths, produced by activating a particular element in the vicinity of $F_0$, will produce an output signal in the output port coupled to the particular element activated in the vicinity of $S_0$. The laser may in general have several output ports, each coupled to a particular element in the vicinity of $S_0$. Therefore the laser may be operated as a switch in which both the output wavelength and the output port can be switched. The implementation of elements of reflecting grating 307 can be optimized as described in the following section.

Value of $\alpha$

Figure 6:
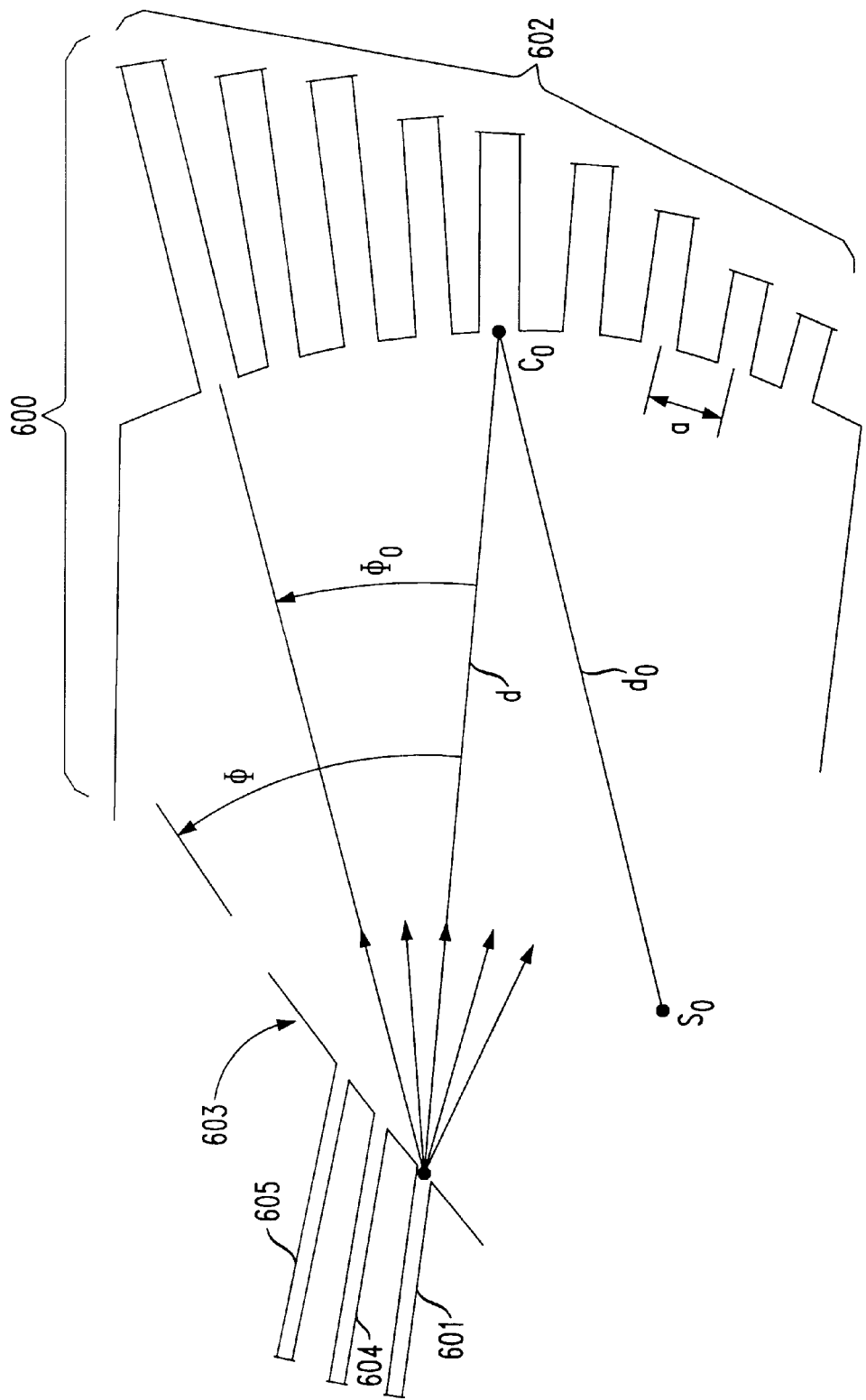
FIG. 6 shows that in order to avoid aperture blockage (FIG. 7) the angle $\phi$ must exceed the angle $\phi_0$ determined by the grating aperture.
Figure 7:
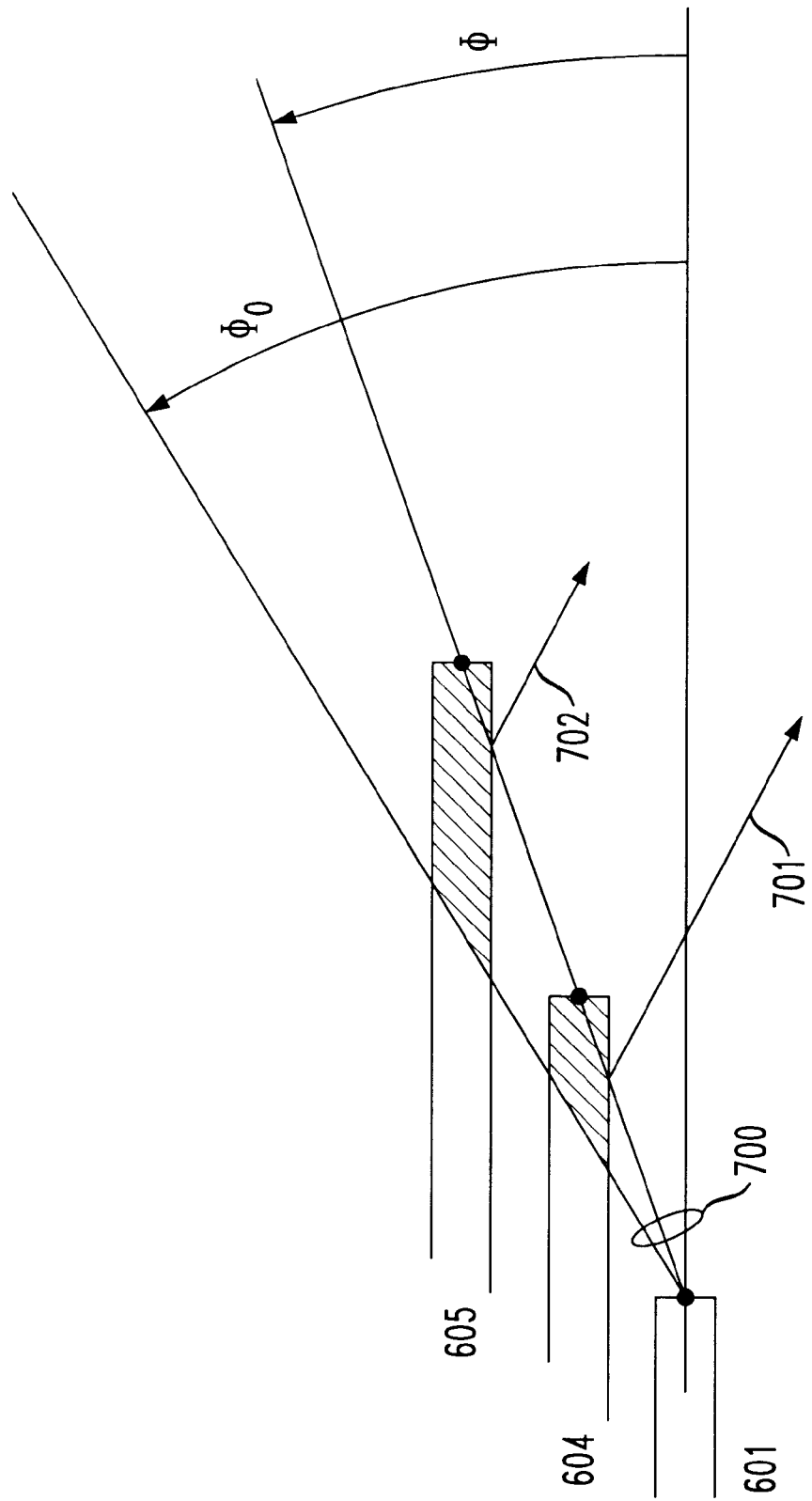
FIG. 7 illustratively shows the unwanted reflections from an illumination pattern which does not satisfy the requirements of FIG. 6.

With reference to FIG. 6, each element 601, 604, 605 is associated with a different optical wavelength. Each element must efficiently illuminate the reflecting grating 602. Therefore the axis of element 601 must be directed towards the center $C_0$ of the grating 602, and its radiation pattern must illuminate efficiently the entire angular aperture $$2\phi_0 = \frac{a(2M+1)}{d},$$

occupied by the grating 602. As shown in FIG. 6, the focal line 603 specifying the locations of the various elements forms an angle $\phi$ which is not orthogonal to the axis of each element. The angle of the focal line with respect to the element axis must satisfy the condition $$\phi > \phi_0 \tag{4}$$

for otherwise some of the elements will occupy the region illuminated by other elements, thus causing undesirable scattering off other elements as shown in FIG. 7. This scattering is undesirable for it causes aperture blockage. As shown in FIG. 7, when the condition of expression (4) is not satisfied, the emissions from element 601 would be scattered off elements 604 and 605 as indicated by, 701 and 702, respectively.

In the above expression (4), one can show that $$\tan(\phi) = -\frac{aQ}{2\alpha d} \tag{5}$$

and, by using the above expression, one can determine the largest value that can be chosen for $\alpha$ without violating expression (4). In expression (5) d is the distance of the wavelength element from the center $C_0$ of the grating 602. The distance $d_0$ is the distance from the source to the center $C_0$ of the grating 602. The relationship between d and $d_0$ is determined by the focal length for a particular wavelength according to the expression $1/f=1/d+1/d_0$.

Efficient Corner Reflector

Figure 8:
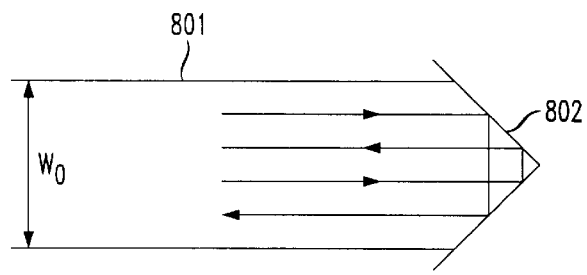
FIG. 8 illustrates the formation of multiple images by a multimoding waveguide.

According to another aspect of the present invention, efficient techniques for reflecting the fundamental mode of a waveguide is described. With reference to FIG. 8, it should be noted that if the waveguide width $W_0$ is large enough, then total reflection can be produced efficiently by etching a corner reflector 802 at the end of the waveguide 801. Each facet of the corner reflector is at 45° with respect to the incident mode, which is therefore totally reflected as indicated in FIG. 8. It is assumed that the waveguide 801 is made of InP or similar material with refractive index not too different 3.30. Then, assuming air on the other side of each facet, total reflection occurs at angles of incidence larger than roughly 18°. However, at the corner and its vicinity the incident power is lost because of scattering by the corner and, for this reason, the above arrangement is only efficient for large widths $W_0$. A more efficient arrangement is realized as shown in FIGS. 9 and 10.

Figure 9:
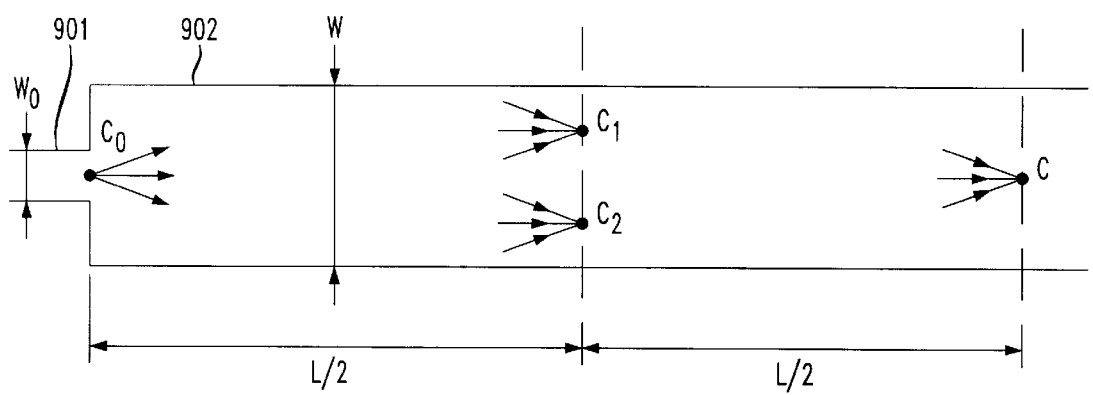
FIG. 9 shows another illustrative waveguide element of the reflecting grating including a multimode waveguide section.

In FIG. 9, the input waveguide 901, of width $W_0$, is connected to a multimoding waveguide 902 of much larger width W. The multimoding waveguide 902 has two well known imaging properties. First, it will transform an input point source $C_0$ into an image c produced at a distance L given by $$\frac{L\lambda}{W^2} = \gamma_0 \tag{6}$$

where the parameter $\gamma_0$ is determined by the waveguide width W, and $\gamma_0=1$ for large W. A second property is that the multimoding waveguide 902 will produce, at half this distance, two separate images $C_1$ and $C_2$ as shown in FIG. 9. In view of these two properties, we now combine the multimoding waveguide technique of FIG. 9 with a corner reflector technique of FIG. 8 to form the multimoding waveguide with corner reflector as shown in FIG. 10.

Figure 10A:
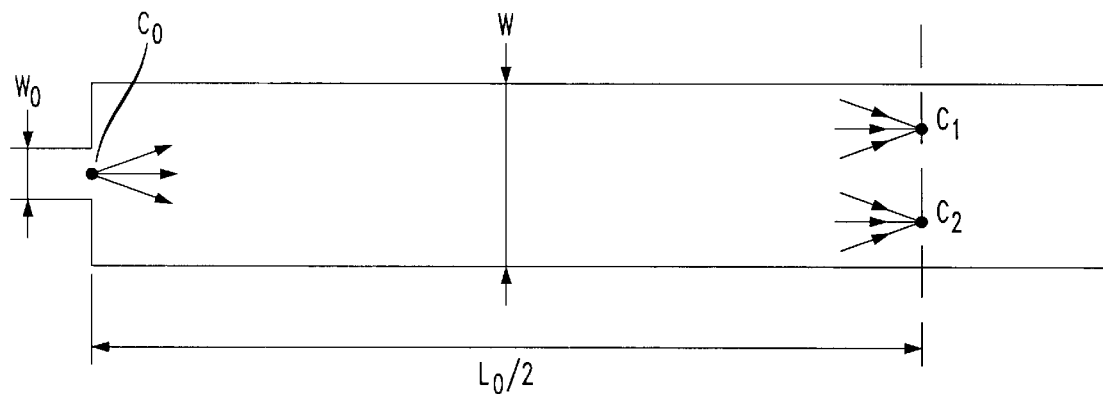
FIGS. 10A and 10B show the construction of another illustrative waveguide element of the reflecting grating including a multimode waveguide section and a corner reflector.
Figure 10B:
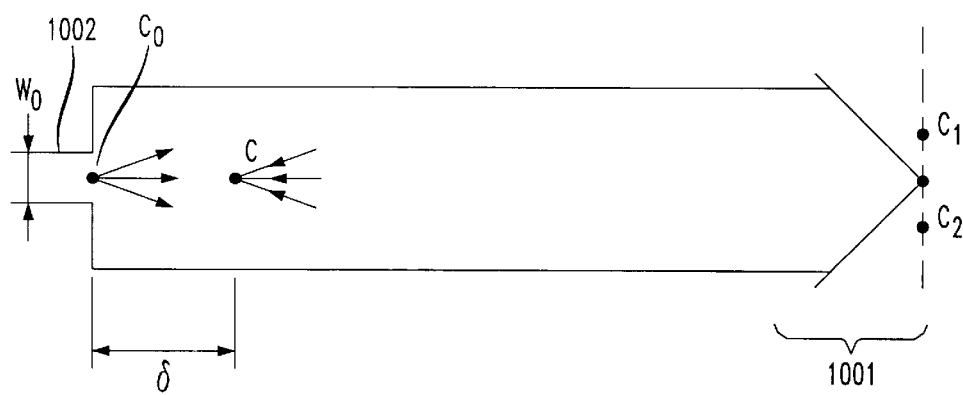

In FIG. 10A the length $L_0/2$ is properly chosen so as to produce at a particular wavelength $\lambda_0$ two separate images $C_1$ and $C_2$ in the vicinity of the two facets of the corner reflector. Thus, as shown in FIG. 10B, only the central portion of each facet of corner reflector 1001 is illuminated, to a good approximation. After reflection, the multimoding waveguide will recombine the two images into a single image C producing, at the aperture of the input waveguide, the fundamental mode to a good approximation.

Notice, this arrangement is only efficient in the vicinity of the design wavelength $\lambda_0$. As shown in FIG. 10B, the input waveguide 1002 essentially acts as a point source located at $C_0$. After reflection by the corner reflector 1001, the input image is transformed into a reflected image C that is generally displaced by $\delta$ from $C_0$. The displacement according to Eq. (6) is given by $$\delta = -\frac{L(\lambda - \lambda_0)}{\lambda} \tag{7}$$

and the resulting power coupling coefficient between the reflected image C and the fundamental mode can be shown to be approximately $$c^2 = \frac{1}{\sqrt{1 + 1.34\left(\frac{\lambda \delta}{w_0^2}\right)^2}} \tag{8}$$

What has been described is merely illustrative of the application of the principles of the present invention. Other methods and arrangements can be implemented by those skilled in the art without departing from the spirit and scope of the present invention.

APPENDIX

REFERENCES

[1] K. R. Poguntke, J. B. D. Soole, A. Scherer, etc. "Simultaneous Multiple Wavelength Operation of a Multistripe Array Grating Integrated Cavity Laser", Appl. Phys. Lett., 1993, 62, (17).

[2] M. Zirngibl, C. H. Joyner, L. W. Stulz, U. Koren, M. D. Chien, M. G. Young and B. I. Miller, "Digitally Tunable Laser Based on the Integration of a Waveguide Grating Multiplexer and an Optical Amplifier", IEEE Photonics Technol. Lett., April 1994.

[3] C. Dragone and I. P. Kaminow, "Rapidly Tunable Integrated Laser", U.S. Pat. No. 5,373,517.

[4] M. Zirngibl and C. H. Joyner, "12 Frequency WDM Laser Based on a Transmissive Waveguide Grating Router", Electronic Letters, 28th April 1994, vol. 30, no. 9, pp. 701–702.

[5] C. Doerr, M. Shirasaki and C. H. Joyner, "Chromatic Focal Plane Displacement in Parabolic Chirped Waveguide Grating Router", IEEE Photon. Technol. Lett., vol. 9, pp. 635–627, May 1997.

[6] C. Dragone, "Efficient Reflector Multiplexer Arrangement," U.S. Pat. No. 5,450,511.

[7] C. Doerr, et al pending U.S. patent application, Filed May 22, 1997, Allowed Sep. 4, 1998, Ser. No. 08/861495, entitled "Wavelength Selectable Laser with Inherent Wavelength and Single-Mode Stability."

What is claimed is:

1. A multiwavelength laser comprising
a laser cavity including a reflective grating, at least a first reflective active element and a plurality of second reflective active elements, the reflective grating having an array of reflecting arms having lengths that vary in a non-linear manner so as to produce a focal length that varies as a function of wavelength;
said reflective grating having a first and second focal curves through a first and second focal point, respectively, such that the curve through either focal point is the locus of the images produced by a particular order of the grating when illuminated from the other focal point, said at least first reflective active element is located at the first focal curve in the vicinity of the first focal point, a plurality of second reflective active elements are located on the second focal curve in the vicinity of the second focal point; and
wherein the first and second focal curves are located at substantially different distances from said reflective grating so that any direct reflection of wavelength is sufficiently reduced and the focal length variation with wavelength changes is sufficiently strong so that any wavelength in any passband outside a selected free spectral range passband is substantially reduced when reflected back from said plurality of second reflective active elements to said at least a first reflective active element.

2. The multiwavelength laser of claim 1 wherein said at least a first reflective element has a width W determined by the expression $W^2/\lambda < \rho$, where $\rho$ is the distance between the focal curves through the first and second focal points and $\lambda$ is the wavelength.

3. The multiwavelength laser of claim 1 wherein said reflective grating includes $M_0$ waveguide arms, where $M_0$ is an integer.

4. The multiwavelength laser of claim 1 wherein said reflective grating includes a plurality of reflector elements each including a multimode waveguide section.

5. The multiwavelength laser of claim 4 wherein each of said multimode waveguide sections is terminated in a corner reflector.

6. The multiwavelength laser of claim 1 wherein the array of reflector elements forming the grating each have a length that is determined by a non-linear expression including a quadratic component.

7. The multiwavelength laser of claim 1 wherein the second foci varies with wavelength $\lambda$ given by the expression $$\frac{1}{f(\lambda)} = 2\left(\frac{1}{R} + \alpha\frac{\lambda - \lambda_1}{a^2}\right)$$

where $\lambda_1$ is the laser center wavelength, R is the grating radial distance from the center of the array of reflecting arms, $\alpha$ is the quadratic component amplitude, and a is the period of the waveguide grating.

8. The multiwavelength laser of claim 1 wherein the angle $\phi$ formed by the axis of a second reflector active element with respect to the focal line, satisfies the condition that $\phi > \phi_0$ where $$2\phi_0 = \frac{a(2M + 1)}{d}$$

and where 2M+1 is the number of waveguides in the reflective grating, $\alpha$ is the period of the grating and d is the distance of the second reflector element from the grating.

9. The multiwavelength laser of claim 1 wherein either the first reflective active element or one of the plurality of second reflective active elements associated with a particular wavelength is electronically controlled to control that particular wavelength of the multiwavelength laser.

10. The multiwavelength laser of claim 1 wherein the laser cavity further includes a second active element located in the vicinity of the first focal point, said second active element being electrically controlled to switch a mulitwavelength laser output signal from said second active element.

11. A multiwavelength laser comprising a laser cavity including a reflective grating, at least a first reflective element and a plurality of second reflective elements, the reflective grating having an array of reflecting arms having lengths that vary in a non-linear manner so as to produce a focal length that varies as a function of wavelength;

said reflective grating having two foci including a fixed first focal point at which said at least a first reflective element is located and a variable second focal point which is wavelength dependent and at which said plurality of second reflective elements are located;

the first and second foci being located at substantially different distances from said reflective grating so that any direct reflection of wavelengths is sufficiently reduced, and the focal length variation with wavelength being sufficiently strong so that any wavelength in any passband outside a selected free spectral range passband is substantially reduced when reflected between said plurality of second reflective elements and said at least a first reflective element; and wherein said first reflective element and one of said plurality of second reflective elements are used to select each of the wavelengths of the multiwavelength laser, and wherein an active element included in either said first reflective element or said one of said plurality of second reflective elements is used to provide gain at the selected wavelengths.

12. A method of making a multiwavelength laser comprising the steps of:

forming a laser cavity including a reflective grating, at least a first reflective active element, and a plurality of second reflective active elements, the reflective grating having an array of reflecting arms having lengths that vary in a non-linear manner so as to produce a focal length that varies as a function of wavelength; and forming said reflective grating having two different focal points including a fixed first focal point at which said at least a first reflective active element is located and a variable second focal point which is wavelength dependent and at which said plurality of second reflective active elements are located, and wherein the first and second foci are located at substantially different distances from said reflective grating so that any direct reflection of wavelengths is sufficiently reduced, wherein the focal length variation with wavelength changes is sufficiently strong so that any wavelength in any passband outside a selected free spectral range passband is substantially reduced when reflected back from said plurality of second reflective active elements to said at least a first reflective active element.

* * * * *